United States Patent [19]
Su et al.

[11] Patent Number: 6,005,259
[45] Date of Patent: Dec. 21, 1999

[54] INAS/GASB SUPERLATTICE STRUCTURE INFRARED DETECTOR FABRICATED BY ORGANOMETALLIC VAPOR PHASE EPITAXY

[75] Inventors: Yan-Kuin Su; Shoou-Jinn Chang; Shi-Ming Chen; Chuing-Liang Lin, all of Tainan, Taiwan

[73] Assignee: National Science Council, Taipei, Taiwan

[21] Appl. No.: 08/935,716

[22] Filed: Sep. 23, 1997

[51] Int. Cl.$^6$ ........................................... H01L 29/06
[52] U.S. Cl. ................... 257/15; 257/21; 257/22
[58] Field of Search ................... 257/15, 17, 21, 257/22, 184, 189, 615

[56] References Cited

PUBLICATIONS

1. Chen et al., "Normal Incidence Intersubband Optical Transition in GaSb / InAs Superlattices," *Appl. Phys. Lett.* 61(5), pp. 509–511, Aug. 1992.

2. Chen et al., "Normal Incidence Intersubband and Interband Optical Transition in GaSb / InAs Superlattices," *PTL*, vol. 7, No. 10, 1995.

3. Chen et al., "Doping Effects on Intersubband and Interband Optical Transition in GaSb / InAs Superlattices," *IEEE QE*, vol. 32, No. 2, 1996.

*Primary Examiner*—Minh Loan Tran
*Attorney, Agent, or Firm*—Bucknam and Archer

[57] ABSTRACT

The invention concerns an InAs/GaSb superlattice infrared detector that is prepared on a GaSb or a GaAs substrate by low pressure organometaleic chemical vapor deposition. The thickness of well and barrier modulated in the superlattice is used to control the wavelength of absorption. As the superlattice is sandwiched by the Si-doped InAs layer, the wavelength of absorption is in the 8~14 $\mu$m range. As the superlattice is sandwiched by the Zn-doped GaSb layer, the wavelength of absorption is in the 3~5 $\mu$m range.

2 Claims, 6 Drawing Sheets

INAS/GASB SUPERLATTICE STRUCTURE INFRARED DETECTOR FABRICATED BY ORGANOMETALLIC VAPOR PHASE EPITAXY

BACKGROUND OF THE INVENTION

1. Field of the Invention

The invention concerns an InAs/GaSb superlattice infrared detector that is prepared on a GaSb or a GaAs substrate by low pressure organometaleic chemical vapor deposition.

3~5 µm and 8~4 µm is the two most penetrating window in the atmosphere; the optical communication for the next generation, in order to decrease the loss of transmission, will also be 3~5 µm as its direction of development. The application of the infrared detector has a wide range of use including communications as well as night vision observation, surgery, resource exploration and etc.

2. Cross-Reference to Related Applications

The previously developed technique of InAs/GaSb superlattice, is concentrated in the area of molecular deposition method. The current molecular deposition method still has problems in its limitation of mass production. The method we employ is the low pressure organometaleic chemical vapor deposition and we successfully deposited a very ideal lattice. In addition, the research of the elements of InAs/GaSb superlattice is still in its stages of development. The structure proposed in this project is one big breakthrough in the research of the element of supperlattice.

Therefore, with the use of low pressure organometaleic chemical vapor deposition, we successfully deposited a high quality of InAs/GaSb superlattice structure, the element of which could be utilized in industrial mass production.

The appropriate range is 3~5 µm and 8~4 µm for photonic infrared detection.

There are many kinds of material; the element of InAs/GaSb superlattice belongs to the photonic infrared detection of normal incidence. Due to the reason that it uses sub-valence band transmission system, it provides a solution for injection of elements at an angle as well as the problem of complicated process of manufacturing. This is a great decrease on the cost of manufacturing. H.H. Chen and others reported, in 1992's Appl. Phys. Lett. of the $61^{st}$ Issue pages 509–511, that InAs/GaSb superlattice has a very high rate of absorption of light. In addition, S. M. Chen and others in the 1995 IEEE Photonics Technology Lett.'s $7^{th}$ Issue pages 1192–1194 and in the 1996 IEEE IEEE J. Quantum Electron.'s $32^{nd}$ Issue pages 277–283 reported that through the control of the thickness of superlattice, the wavelength desired maybe attained. Therefore the InAs/GaSb superlattice element is very flexible and full of market potentials.

If without the alterations of the Fermi Energy Level but purely with the thickness control, there still could be no special level of energy transmission. Therefore, we have catered for the different wavelength (3~5 µm and 8~4 µm )of absorption. Different substrate materials for superlattice were used( e.g. positive GaSb and negative InAs) . The utilization of thick substrates to control the position of Fermi's Energy Level so that the required level of energy transmission may be achieved.

SUMMARY OF THE INVENTION

The invention concerns an InAs/GaSb superlattice infrared detector that is prepared on a GaSb or a GaAs substrate by low pressure organometaleic chemical vapor deposition. The thickness of well and barrier modulated in the superlattice is used to control the wavelength of absorption.

Some other photo-detectors can't using in normal-incidence. The purpose of the invention is due to the reason that the current photo-detector uses sub-conducting transmission so that the ratio of normal incidence is quite small. The provision of specially processed(light filter or tilted surface) is required for usage. The InAs/GaSb supperlattice infrared detector uses sub-valence band transmission and conduction to valence band transmission; therefore it possess the advantage of normal incidence.

Due to the thickness of the supperlattice, we can easily control the position of the absorbed wavelength so that detectors of different wavelength in application may be produced.

BRIEF DESCRIPTION OF THE DRAWINGS

In order to achieve the aforementioned purpose and structure, this invention has its design and functions described in detail with the use of illustrative figures as follows:

SIMPLE DESCRIPTION OF ILLUSTRATIVE FIGURES & ITS NUMERICALS

Figure 1A:
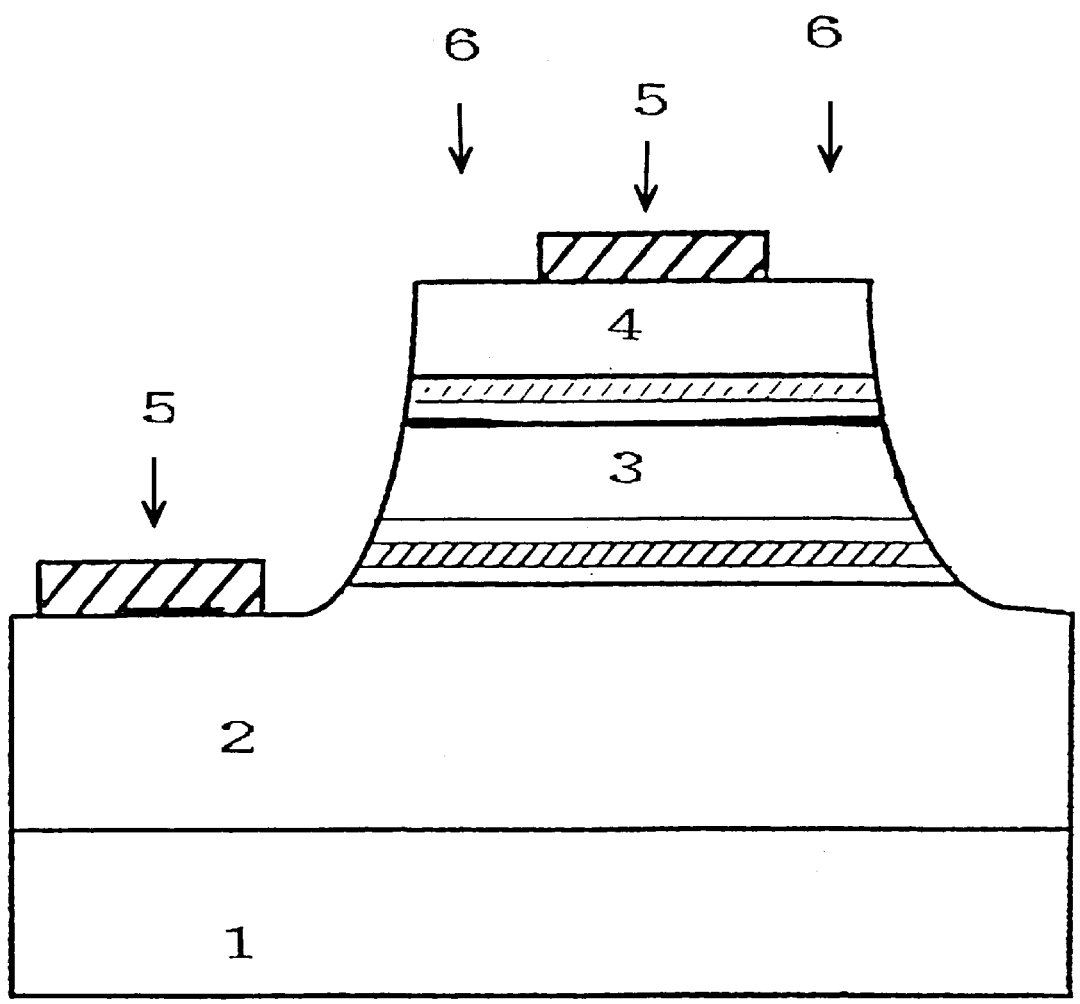
Figure 1B:
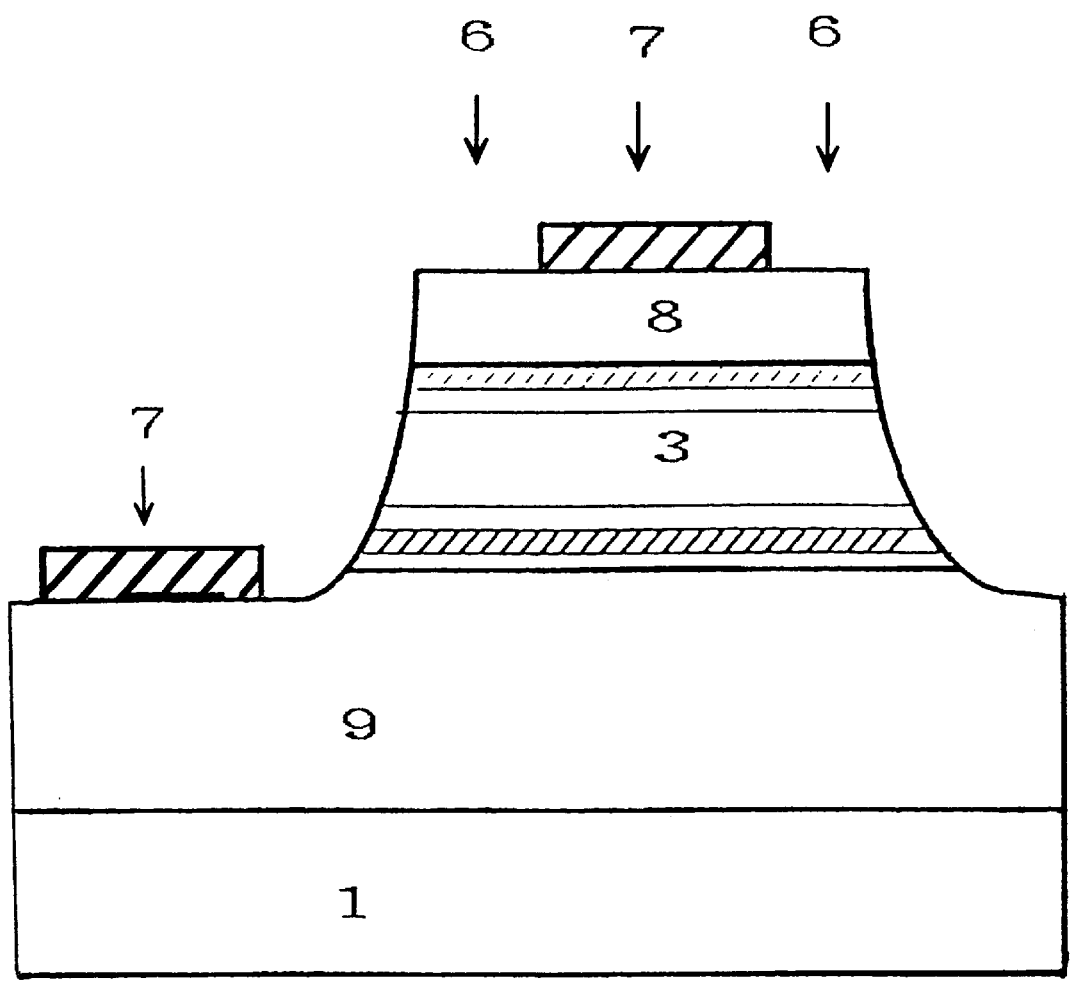

FIGS. 1(a)–1(b): This is the side view of the Elemental Structure

FIG. 1(a). negative InAs is used as the superlattice substrat

Figure 2A:
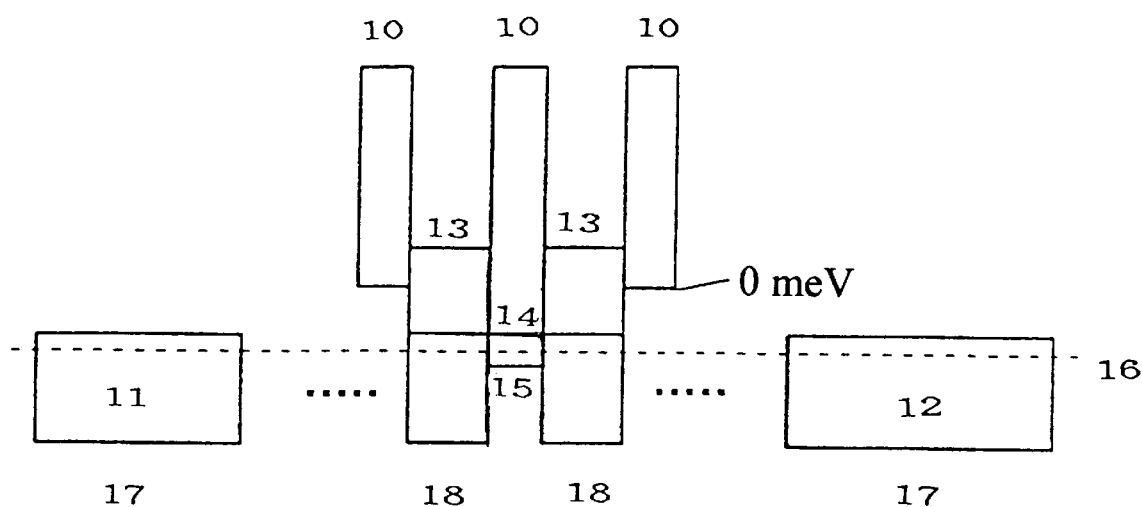
Figure 2B:
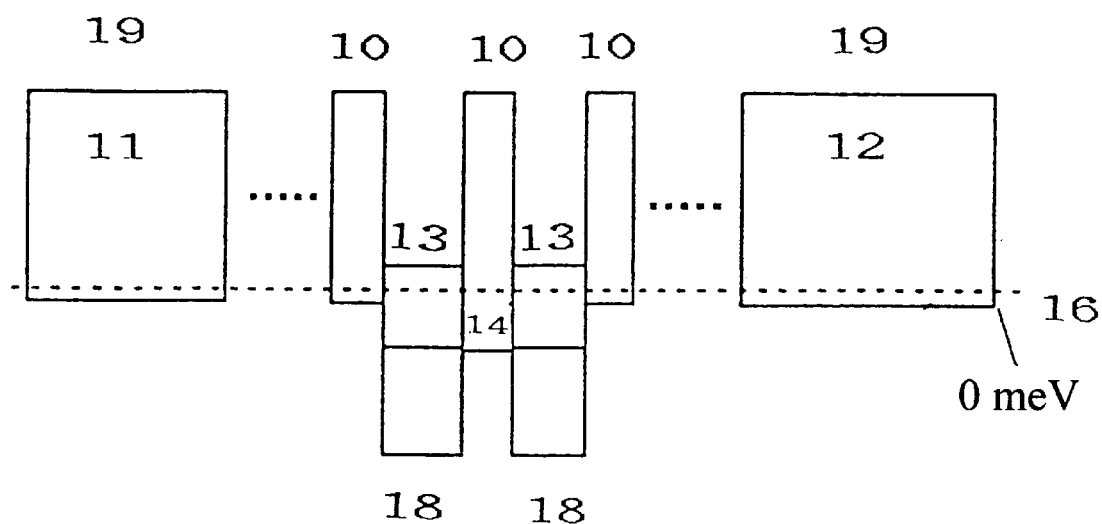

FIG. 1(b) positive GaSb is used as the sperlattice substrate
1 GaSb Substrate
2 1 µm InAs: Si
3 InAs/GaSb SLS
4 In As/Si
5 AuGeNi
6 hυ( special symbol υ)
7 AuZn
8 GaSb: Zn
9 1 µm GaSb: Zn FIGS. 2(a)–2(b) are the sandwiching of Negative InAs and Positive GaSb FIG. 2(a) . Negative InAs as the sandwiching. Its Fermi Energy Level (Ef) falls between the first heavy hole band (HH1) and the first light hole band(LH1); it could be used for the application of 8~–14 µm.

FIG. 2(b). Positive GaSb as the sandwiching. Its Fermi Energy Level (Ef) falls between the first conducting band (C1) and the first heavy hole band(HH1);it could be used for the application of 3~5 µm.
10 GaSb
11 cap layer
12 buffer layer
13 C1
14 HH1
15 LH1
16 Ef
17 N-type InAs
18 InAs
19 P-type GaSb FIG. 3: The spectrum absorbed by the 50 period GaSb/InAs supperlattice during temperatures of 300 K. Its GaSb/InAs thickness is 18~24 angstrom. Its superlattice structure is negative GaSb.

Figure 4:
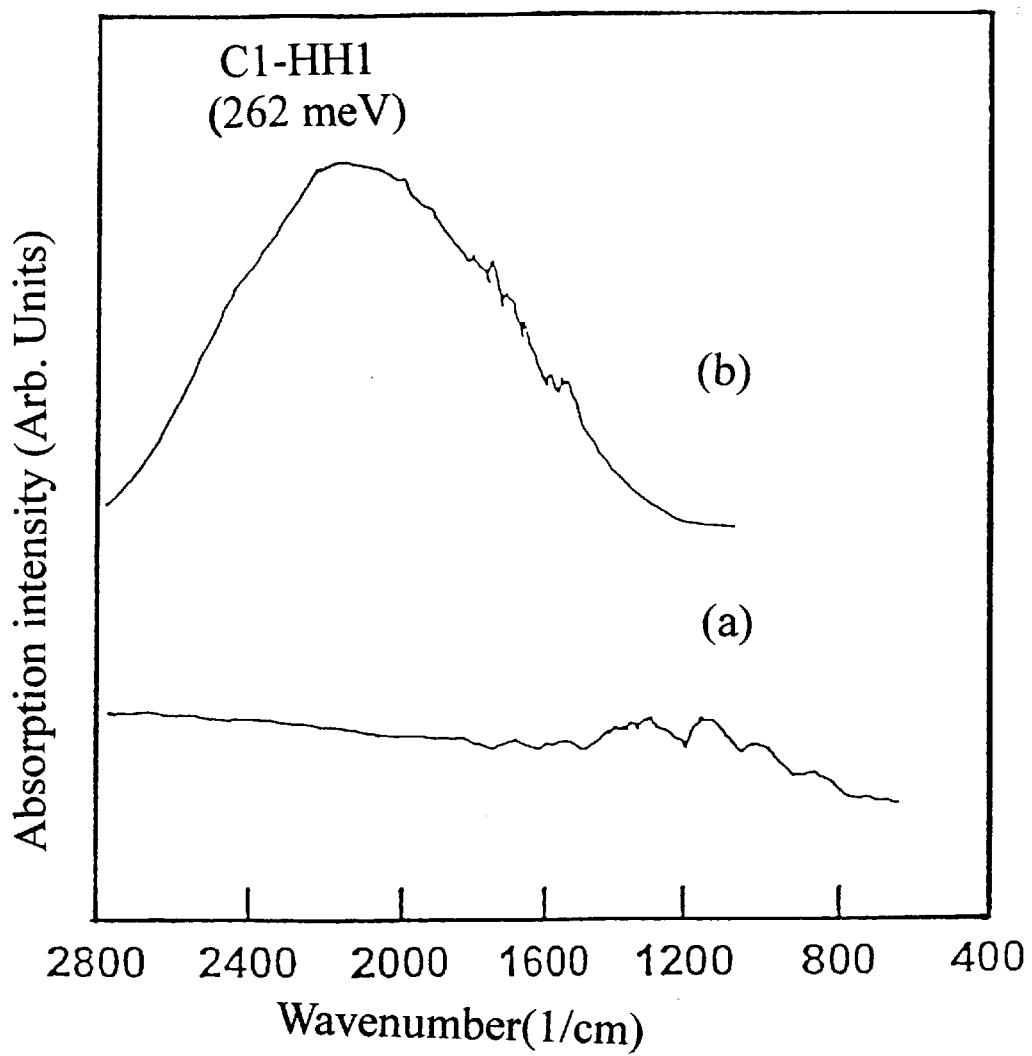

FIG. 4 : The spectrum absorbed by the 50 period GaSb/InAs supperlattice during temperatures of 300 K. Its GaSb/InAs thickness is 18~24 angstrom.

Its superlattice structure is positive GaSb.

Curve (a). positive GaSb layer had a doped density of $1/3 \times 10^{16} cm^{-2}$ Curve (b) positive GaSb layer had a doped density of $1/3 \times 10^{18} \text{cm}^{-2}$.

DETAILED DESCRIPTION OF THE INVENTION

The invention concerns an InAs/GaSb superlattice infrared detector that is prepared on a GaSb or a GaAs substrate by low pressure organometaleic chemical vapor deposition. The V to III ratio of the InAs supperlattice layer is 28.7 and the V to III ratio of the GaSb layer is 78.5. In the process of growth of the supperlattice, among the interchanges of different materials. As gas or organic Sb is used to fill the growth cabin to prevent the element of V group evaporation the time used is 5 seconds.

Through the technique of photoresistor, the deposited element is etching into a form of platform by the method of wet etching. After the etching, another photoresistor is applied. A vacuum vapor machine is used to evaporate the Ohmic contact on both ends of the layer. Although InAs/GaSb superlattice infrared detector is designed for normal incidence, the injection from behind is also possible.

The Element Structure: Refer to FIG. 1 for the structure of two kinds of InAs/GaSb supperlattice infrared detector element.

(a). negative InAs as the supperlattice sandwiching layer. Its Fermi Energy Level (Ef) falls between the first heavy layer(HH1) and the first light layer (LH1); it could be used for the application of 8~14 $\mu$m.

(b). positive GaSb as the supperlattice sandwiching layer. Its Fermi Energy Level (Ef) falls between the first conducting layer (C1) and the first heavy layer (HH1); it could be used for the application of 3~5 $\mu$m.

Both of these absorption structures which we have just raised all possible.

Technical Content, Specialty and Functions

Using(100) GaAs or GaSb as the substrate and TEGa, TMSb, TMIn and 15% Using AsH$_3$ as the source of deposition, temperatures may be fixed at 10.5° C. (TEGa), −10° C. (TMIn), 20° C. (TMIn).

The doped-source of positive GaSb is DEZn. The negative doped-source of InAs is 500 ppm of SiH$_4$. The main current of the Hydrogen (H$_2$) gas is 2 S1m.

The V to III ratio of the GaSb superlattice structure is 75.5 and 28.7 for the V to III ratio of InAs. In the process of growth of the supperlattice, among the interchanges of different materials, As gas or organic Sb is used to fill the growth cabin so that control of the superlattice in the V elements rich may be achieved; the time used is 5 seconds.

Through the technique of photoresistor, the deposited element is etching into a form of platform by the method of wet etching. After the etching, another photoresistor is applied. A vacuum vapor machine is used to evaporate the Ohmic contact resistor on both ends of the layer. Refer to FIG. 1 for the actual element.

(a). is the element structure suitable for the application of 8~14 $\mu$m.

(b). is the element structure suitable for the application of 3~5 $\mu$m.

Principal Of Its Operation

The adjustment of the relative thickness of the energy barrier and energy well in the superlattice is used to alter the difference in energy level of the layer. Due to the reason that the thickness of the superlattice layer is far greater than the total thickness of the superlattice, the position of the Fermi Energy Level (Ef) in the superlattice will be effected by the outer layers. Through the adjustment of the doped-density of the outer layer, the position of the Fermi Energy Level (Ef) is placed at the desired energy layer.

In FIG. 2:

(a). negative InAs as the supperlattice sandwiching layers. Its Fermi Energy Level(Ef) falls between the first heavy hole band(HH1) and the first light hole band(LH1); it could be used for the application of 8~14 $\mu$m.

(b). positive GaSb as the supperlattice sandwiching layers. Its Fermi Energy Level falls between the first conducting band(C1) and the first heavy hole band (HH1);

it could be used for the application of 3~5 $\mu$m.

Both of these absorption structures which we have just raised all possible.

Characteristic Of The Element

Figure 3:
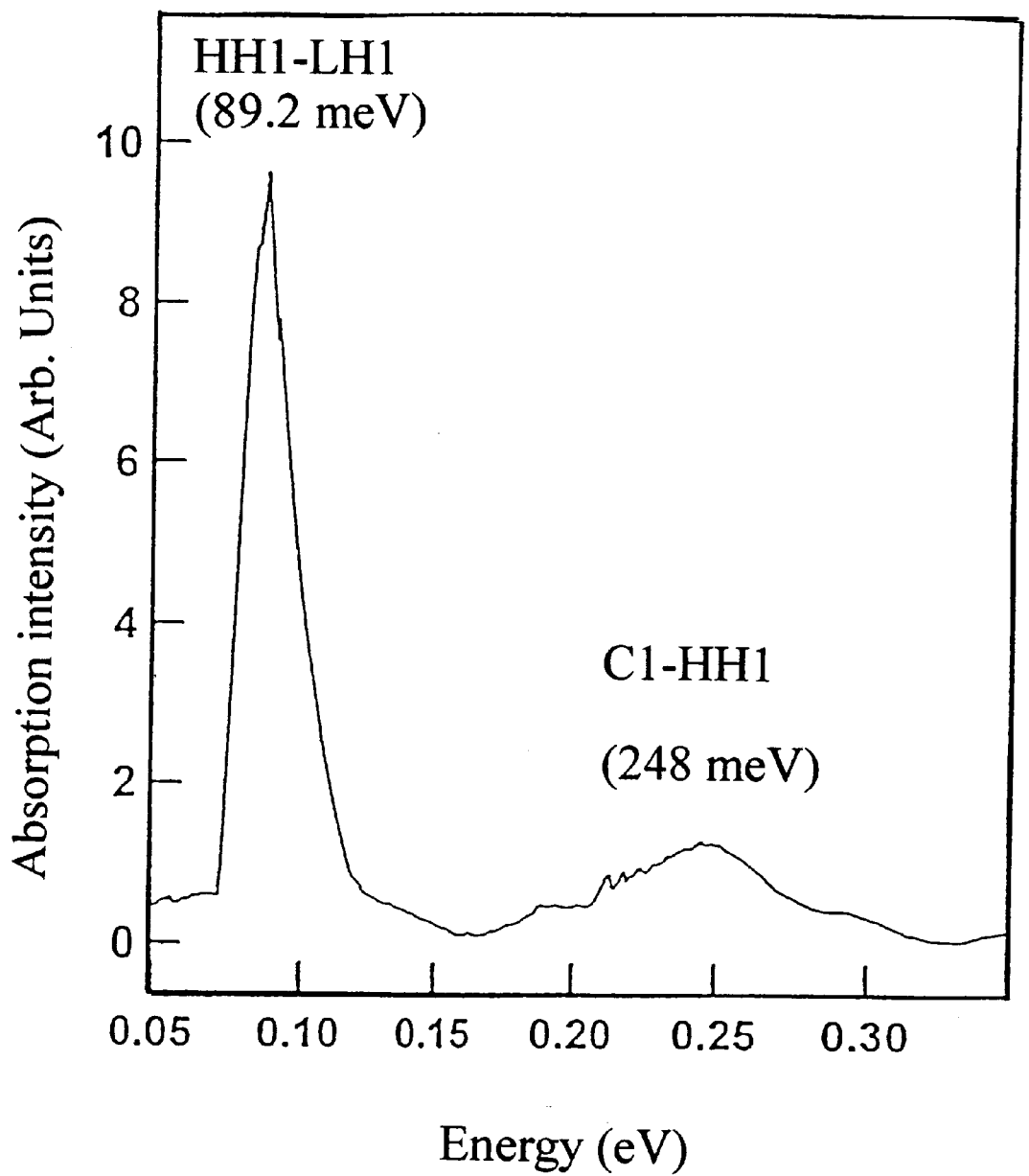

FIG. 3 is the absorption spectrum of the element of negative InAs superlattice sandwiching layers. Its wavelength absorption at room temperature is 13.9 micro-meter.

FIG. 4 is the absorption spectrum of the element of positive GaSb superlattice sandwiching layers. Unsuitable doped-density of the superlattice will cause the element to not be able to absorb.

As in Curve (a), suitable doped-density of the superlattice will cause the element to be able to absorb. As in Curve (b) its wavelength absorption at room temperature is 4.7 micrometer. Normal incidence of infrared rays can be absorbed. This way, the complicated process of guiding the lights will not be needed.

What is claimed is:

1. An InAs/GaSb superlattice infrared detector prepared on a GaSb or a GaAs substrate by low pressure organometallic chemical vapor deposition, the V to III ratio of the InAs superlattice layer is 28.7 and the V to III ratio of the GaSb layer is 78.5.

2. The InAs/GaSb infrared detector according to claim 1 comprising an element structure selected from the group consisting of an n-type InAs superlattice sandwiching layer having its Fermi Energy Level (EF) falling between the first heavy hole band (HH1) and the first light hole band (LH1) that is suitable for the application of 8–14 $\mu$m wave length and a p-type GaSb superlattice sandwiching layer having its Fermi Energy Level (EF) falling between the first conducting band (C1) and the first heavy hole band (HH1) that is suitable for the application of 3–5 $\mu$m wave length.

* * * * *